(12) United States Patent
Lee et al.

(10) Patent No.: US 7,803,469 B2
(45) Date of Patent: Sep. 28, 2010

(54) WHITE ORGANIC LIGHT EMITTING DIODE AND METHOD FOR MANUFACTURING THE SAME

(75) Inventors: Jun Yeob Lee, Yongin (KR); Mi Kyung Kim, Seongnam (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 1110 days.

(21) Appl. No.: 11/457,485

(22) Filed: Jul. 14, 2006

(65) Prior Publication Data

US 2007/0099026 A1 May 3, 2007

(30) Foreign Application Priority Data

Jul. 15, 2005 (KR) .................. 10-2005-0064459

(51) Int. Cl.
*H05B 33/14* (2006.01)

(52) U.S. Cl. .............. 428/690; 428/917; 313/504; 313/506

(58) Field of Classification Search .......... 313/504, 313/506; 428/690, 917
See application file for complete search history.

(56) References Cited

U.S. PATENT DOCUMENTS

| 6,285,039 B1 | 9/2001 | Kobori et al. |
| 6,392,250 B1* | 5/2002 | Aziz et al. ............... 257/40 |
| 6,447,934 B1 | 9/2002 | Suzuki et al. |
| 6,720,092 B2 | 4/2004 | Hatwar |
| 2005/0221121 A1* | 10/2005 | Ishihara et al. ............ 428/690 |

FOREIGN PATENT DOCUMENTS

| CN | 1372434 | 10/2002 |
| JP | 2004311420 | 11/2004 |

OTHER PUBLICATIONS

Chinese Office Action dated Sep. 5, 2008.

* cited by examiner

*Primary Examiner*—David Wu
*Assistant Examiner*—Vu A Nguyen
(74) *Attorney, Agent, or Firm*—H.C. Park & Associates, PLC

(57) ABSTRACT

A white organic light emitting diode (OLED) includes an emission layer that includes a blue emission layer and an emission layer excluding blue. The emission layer excluding blue includes a phosphorescent material and a mixture of a hole transporting material and electron transporting material.

17 Claims, 2 Drawing Sheets

WHITE ORGANIC LIGHT EMITTING DIODE AND METHOD FOR MANUFACTURING THE SAME

CROSS-REFERENCE TO RELATED APPLICATIONS

This application claims priority to and the benefit of Korean Patent Application No. 10-2005-0064459, filed on Jul. 15, 2005, which is hereby incorporated by reference for all purposes as if fully set forth herein.

BACKGROUND

1. Field of the Invention

The present invention relates to an organic white light emitting diode (OLED) and a method for manufacturing the same, and, more particularly, to a white OLED in which the structure and material of an emission layer are improved so that the emission efficiency and the life-span of the white OLED are increased.

2. Discussion of the Background

In general, an organic light emitting diode (OLED) may include a substrate, an anode, an organic layer including an emission layer, and a cathode. An OLED is a spontaneous emission display that generates light by combining electrons and holes in the emission layer. OLEDs are advantageous because they may be driven at a low voltage, may have a high response speed, and may have a wide viewing angle. OLEDs may be used in light and thin information display devices, such as mobile telephones, to display images with high picture quality.

OLEDs that effectively generate white light may be used for a wide variety of applications, such as backlights in LCD displays, internal lights of vehicles, and illuminators in offices. White light OLEDs may be used with primary color filters, such as red, blue, and green filters, in color flat panel displays.

According to a first OLED manufacturing method, the emission layer may be composed of multiple layers that emit red, blue, and green. However, it is difficult to form the multiple layers, and the thickness of the emission layer must be obtained through trial and error to achieve white light. Furthermore, without regulation, the color of the light may change significantly with changes in the voltage. Also, the stability of the white OLED may deteriorate so that the life-span of the white OLED is very short.

According to a second OLED manufacturing method, an emission layer host material is doped with, or mixed with, an organic light emitting pigment. The processes of the second method are simpler than the processes of the first method. However, in the second method, the thin film that emits white light must also be obtained through trial and error. Furthermore, it may be difficult to control the doping concentration during mass production because the doping concentration is very small. Also, the color may change in response to small changes in the concentration of the dopant.

Therefore, there remains a need for white OLEDs having excellent emission efficiency and long life-spans.

SUMMARY OF THE INVENTION

This invention provides a white organic light emitting diode (OLED) with an improved emission efficiency and increased life-span and a method of making the same.

Additional features of the invention will be set forth in the description which follows, and in part will be apparent from the description, or may be learned by practice of the invention.

The present invention discloses a white organic light emitting diode, including an emission layer arranged between a first electrode and a second electrode, wherein the emission layer includes a blue emission layer and an emission layer excluding blue, the emission layer being capable of emitting white light, and wherein the emission layer excluding blue includes a phosphorescent material and a mixture comprising a hole transporting material and an electron transporting material.

The present invention also discloses a method of manufacturing a white organic light emitting diode, including forming a first electrode on a substrate; forming a blue emission layer on the first electrode; forming an emission layer excluding blue on the blue emission layer; and forming a second electrode on the emission layer excluding blue, wherein the emission layer excluding blue is formed by doping a mixture of hole transporting material and electron transporting material with phosphorescent material.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
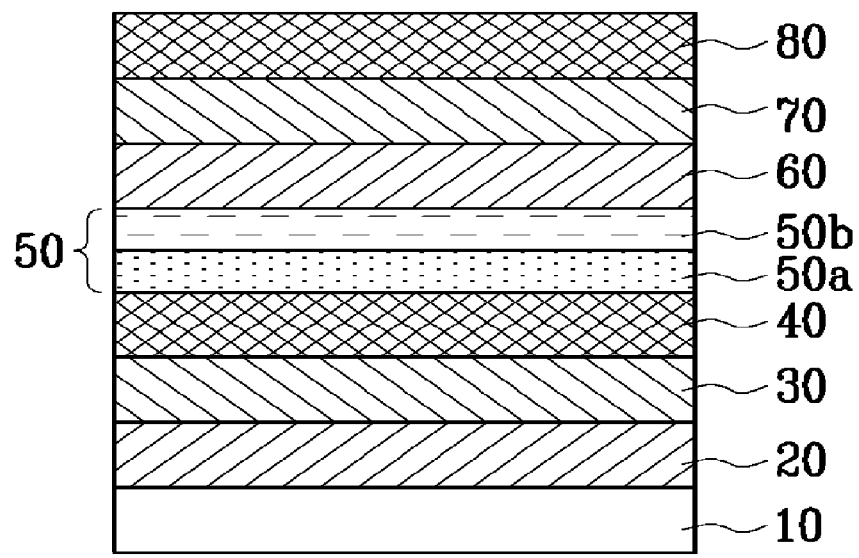
FIG. 1 is a cross-sectional view showing the structure of a white organic light emitting diode (OLED) according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element such as a layer, film, region or substrate is referred to as being "on" another element, it can be directly on the other element or intervening elements may also be present. In contrast, when an element is referred to as being "directly on" another element, there are no intervening elements present.

A white OLED according to an exemplary embodiment of the present invention may include a double-layered emission layer obtained by stacking an emission layer that emits blue light (blue emission layer) and another emission layer that does not emit blue light (emission layer excluding blue) between a first electrode (anode) and a second electrode (cathode). The emission layer excluding blue may include a phosphorescent material and a mixture of a hole transporting material and an electron transporting material.

According to an exemplary embodiment of the present invention, a hole injecting layer and/or a hole transporting layer may be sequentially stacked between a first electrode and the emission layer. Furthermore, a hole blocking layer, an electron transporting layer, and/or an electron injecting layer may be sequentially stacked between the emission layer and a second electrode. An intermediate layer may be inserted between any two layers to improve an interlayer interface characteristic.

According to an exemplary embodiment of the present invention, the emission layer may have a double-layered structure in which a blue emission layer is stacked on a yellow emission layer or in which a yellow emission layer is stacked on a blue emission layer. According to another exemplary embodiment, the emission layer may have a double-layered structure in which a blue emission layer is stacked on a red and green mixed emission layer or a red and green mixed emission layer is stacked on a blue emission layer. According to another exemplary embodiment, the emission layer may have a three-layered structure in which a blue emission layer, a green emission layer, and a red emission layer are sequentially stacked, or where a red emission layer, a green emission layer, and a blue emission layer are sequentially stacked.

The blue emission layer may include fluorescent material or phosphorescent material. For example, an iridium (Ir) derivative, such as bis(fluorophenylpyridine) iridium picolinate (FIrpic) may be used as the blue emission layer. An anthracene derivative, such as biphenylanthracene and a styrylbenzen derivate such as 4,4'-bis(diphenylamino)stilbene (PAS) as the fluorescent material may be used as the blue emission layer.

The emission layer excluding blue may include a mixture of hole transporting material and electron transporting material as the host and may also include a phosphorescent material as the dopant.

Materials that include a carbazole unit may be used as the hole transporting material. For example, at least one material selected from the group of 1,3,5-triscarbazolylbenzene; 4,4'-biscarbazolylbiphenyl; polyvinylcarbazole; m-biscarbazolylbiphenyl; 4,4'-biscarbazolyl-2,2'-dimethylbiphenyl; 4,4',4''-tris(N-carbazolyl)triphenylamine; 1,3,5-tris(2-carbazolylphenyl)benzene; 1,3,5-tris(2-carbazolyl-5-methoxyphenyl)benzene; and bi(4-carbazolylphenyl)silane may be used.

Organic metal based materials, such as aluminum, zinc, beryllium, or potassium based materials, materials including an oxadiazol unit, materials including a triazine unit, materials including a triazol unit, and materials including a spirofluorene unit may be used as the electron transporting material. For example, at least one material selected from the group of bis(8-hydroxyquinolato)biphenoxy aluminum; bis(8-hydroxyquinolato)phenoxy aluminum; bis(2-methyl-8-hydroxyquinolato)biphenoxy aluminum; bis(2-methyl-8hydroxyquinolato)phenoxy aluminum; bis(2-(2-hydroxyphenyl)quinolato)zinc; (4-biphenylyl)-5-(4-tert-butylphenyl)-1,3,4- oxadiazol; 2,9-dimethyl-4,7-diphenyl-1, 10-phenanthroline(BCP); 2,4,6-tris(diarylamino)-1,3,5-triazine; and 3-phenyl-4-(1'-naphthyl)-5-phenyl-1,2,4-triazol may be used.

The hole transporting material and the electron transporting material may be mixed with each other in a weight ratio of about 1:9 to 9:1. When the mixing ratio of the hole transporting material and the electron transporting material deviates from the range described above, the characteristics of the diode in which the hole transporting material and the electron transporting material are used as the host may not be improved.

When a yellow emission layer is used as the emission layer excluding blue, bis(phenylquinoline) iridium acetylacetonate (Ir(pq)2acac) may be used as a yellow phosphorescent dopant. When a red and green mixed emission layer or a red layer and a green layer is used as the emission layer excluding blue, bis(phenylisoquinoline) iridium acetylacetonate (Ir (piq)2acac) may be used as a red phosphorescent dopant and tris(phenylpyridine) iridium (Irppy3) may be used as a green phosphorescent dopant.

The amount of the phosphorescent material may be about 1 to 20 weight percent (wt %) of the mixture of the hole transporting material and the electron transporting material. When the amount of the phosphorescent material is less than about 1 wt %, it may be difficult to control the doping concentration. When the amount of the phosphorescent material is more than about 20 wt %, the efficiency and color characteristics may deteriorate.

According to an exemplary embodiment of the present invention, the entire emission layer may be about 20 to 60 nm thick. The blue emission layer may be about 10 to 50 nm thick, and the emission layer excluding blue may be about 10 to 50 nm thick. When the emission layer excluding blue is less than about 10 nm thick, the blue light emission is so weak that the chromaticity coordinates may shift to red. When the emission layer excluding blue is more than about 50 nm thick, the blue light emission is so strong that the chromaticity coordinates may shift to blue. When the emission layer is double-layered, the yellow emission layer may be about 10 to 50 nm thick, and the green and red mixed emission layer may be about 10 to 50 nm thick. When the emission layer has three-layers, the green emission layer may be about 5 to 45 nm thick and the red emission layer may be about 5 to 45 nm thick.

Figure 2:
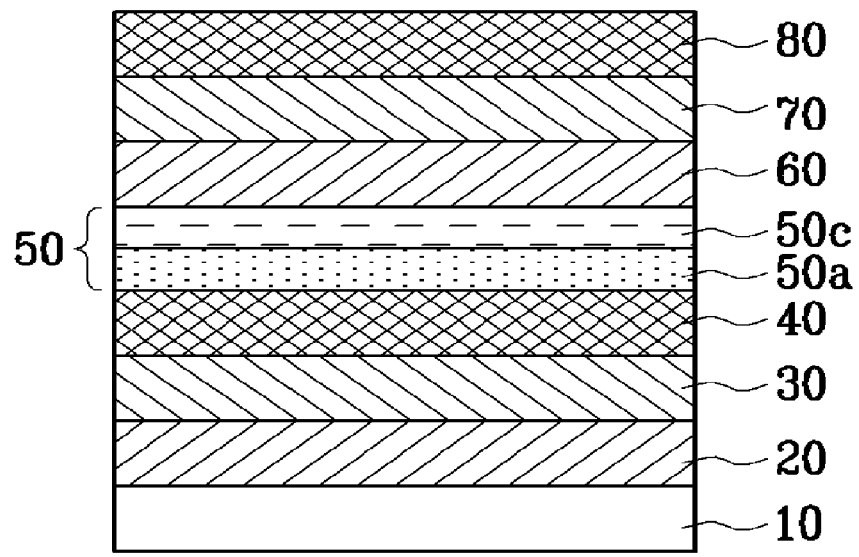
FIG. 2 is a cross-sectional view showing the structure of a white OLED according to an exemplary embodiment of the present invention.
Figure 3:
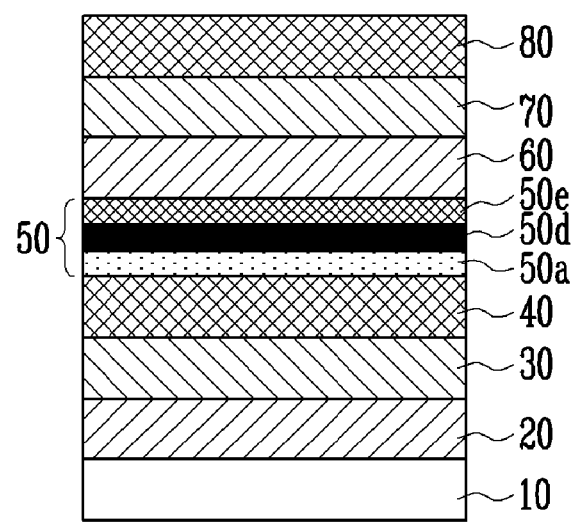
FIG. 3 is a cross-sectional view showing the structure of a white OLED according to an exemplary embodiment of the present invention.

FIG. 1, FIG. 2 and FIG. 3 schematically illustrate the stacked structures of white OLEDs according to exemplary embodiments of the present invention.

Referring to FIG. 1, a white OLED may include a first electrode 20 stacked on a substrate 10, and a hole injecting layer 30, a hole transporting layer 40, an emission layer 50, including a blue emission layer 50a and a yellow emission layer 50b, an electron transporting layer 60, an electron injecting layer 70, and a second electrode 80 sequentially stacked on the first electrode 20.

The white OLED of FIG. 2 may include a stacked structure in which a red and green mixed emission layer 50c replaces the yellow emission layer 50b of the white OLED of FIG. 1.

The white OLED of FIG. 3 may include a stacked structure in which a three-layered emission layer including a blue emission layer 50a, a green emission layer 50d, and a red emission layer 50e replaces the double-layered emission layer of FIG. 1.

Although not shown in the drawings, the OLED may include a hole blocking layer and an intermediate layer for improving the interlayer interface characteristics.

A method of manufacturing a white OLED according to an exemplary embodiment of the present invention will now be described.

First, a patterned first electrode 20 may be formed on a substrate 10. The substrate 10 may be a glass substrate or a transparent plastic substrate with excellent transparency, surface flatness, ease of handling, and waterproof properties. The substrate may be about 0.3 to 1.1 mm thick.

The first electrode 20 may be formed of conductive metal or an oxide thereof into which holes may be easily injected. Examples include indium tin oxide (ITO), indium zinc oxide (IZO), nickel (Ni), platinum (Pt), gold (Au), and iridium (Ir).

The substrate on which the first electrode 20 is formed may be cleaned, and then ultraviolet (UV)/ozone processing may be performed. An organic solvent, such as isopropanol (IPA) or acetone may be used. The cleaned substrate and electrode may be plasma processed under vacuum.

The hole injecting material may be vacuum thermal deposited or spin coated on the first electrode 20 to form the hole injecting layer 30. The hole injecting layer 30 may reduce the contact resistance between the first electrode 20 and the emission layer 50 and may improve the hole transporting property of the first electrode 20 with respect to the emission layer 50. This may reduce the driving voltage and increase the life-span of the OLED.

The hole injecting layer 30 may be about 300 to 1,500 Å thick. When the hole injecting layer 30 is less than about 300 Å thick, the life-span of the OLED may be reduced, the reliability of an organic EL device may deteriorate, and a passive matrix organic EL may generate a short in the pixel. When the hole injecting layer 30 is more than about 1,500 Å thick, the required driving voltage may increase.

Copper phthalocyanine (CuPc) or a starburst amine such as TCTA, m-MTDATA, and IDE406 (Idemitsu Co. LTD material) may be used as the hole injecting material.

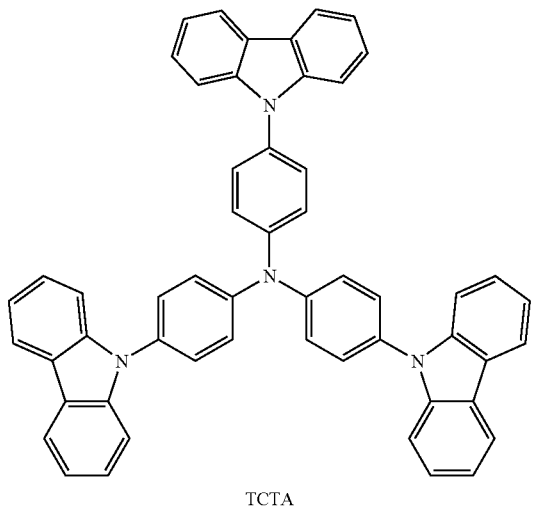

TCTA

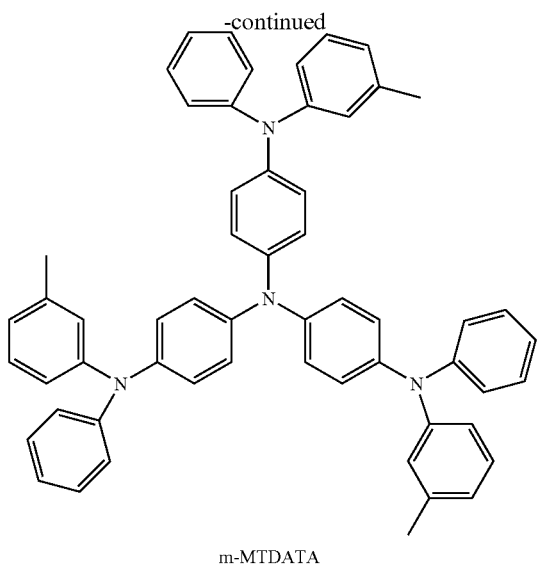

m-MTDATA

The hole transporting material may be vacuum thermal deposited or spin coated on the hole injecting layer 30 to form the hole transporting layer 40. The hole transporting material may be formed of N,N'-bis(3-methylphenyl)-N,N'-diphenyl-[1,1-biphenyl]-4,4'diamine(TPD), N,N'-di(naphthalene-1-yl)-N,N'-diphenyl benzidine, N,N'-di(naphthalene-1-yl)-N, N'-diphenyl-benzidine:α-NPD), or IDE320 (Idemitsu Co. LTD material). The hole transporting layer may be about 100 to 400 Å thick. When the hole transporting layer is less than about 100 Å thick, the hole transporting property may deteriorate. When the hole transporting layer is more than 400 Å thick, the driving voltage may increase.

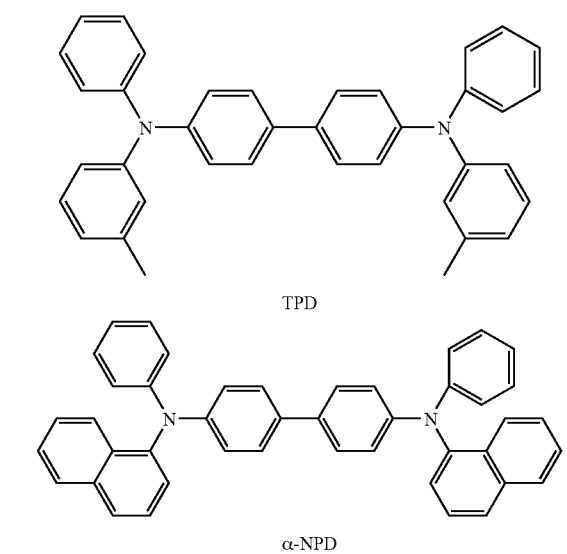

TPD

α-NPD

The emission layer 50 may be formed on the hole transporting layer 40 by vacuum thermal deposition or spin coating.

The emission layer 50 may have a double-layered structure including a blue emission layer 50a and a yellow emission layer 50b as illustrated in FIG. 1, or a blue emission layer 50a and a green and red mixed emission layer 50c as illustrated in FIG. 2, or may have a three-layered structure including a blue emission layer 50a, a green emission layer 50d, and a red emission layer 50e as illustrated in FIG. 3.

The blue emission layer 50a may be formed of materials well-known in the art, such as FIrpic with a carbazole-biphenyl (CBP) host.

A mixture of the hole transporting material and the electron transporting material may be used as the host material included in the yellow emission layer 50b, the green and red mixed emission layer 50c, the green emission layer 50d, and the red emission layer 50e. Phosphorescent materials that emit the respective colors may be used as dopant materials.

Materials including a carbazole unit may be used as the hole transporting material. For example, at least one selected from the group of 1,3,5-triscarbazolylbenzene; 4,4'-biscarbazolylbiphenyl; polyvinylcarbazole; m-biscarbazolylbiphenyl; 4,4'-biscarbazolyl-2,2'-dimethylbiphenyl; 4,4',4''-tri(N-carbazolyl)triphenylamine; 1,3,5-tris(2-carbazolylphenyl)Benzene; 1,3,5-tris(2-carbazolyl-5-methoxyphenyl)benzene; and bi(4-carbazolylphenyl)silane may be used. Organic metal based materials such as aluminum, zinc, beryllium, or potassium based materials, materials including an oxadiazol unit, materials including a triazine unit, materials including a triazol unit, and materials including a spirofluorene unit may be used as the electron transporting material. For example, at least one selected from the group of bis(8-hydroxyquinolato)biphenoxy aluminum; bis(8-hydroxyquinolato)phenoxy aluminum; bis(2-methyl-8-hydroxyquinolato)biphenoxy aluminum; bis(2-methyl-8hydroxyquinolato)phenoxy aluminum; bis(2-(2-hydroxyphenyl)quinolato)zinc; (4-biphenylyl)-5-(4-tert-butylphenyl)-1,3,4-oxadiazol; 2,9-dimethyl-4,7-diphenyl-1,10-phenanthroline(BCP); 2,4,6-Tris(diarylamino)-1,3,5-triazine; and 3-phenyl-4-(1'-naphthyl)-5-phenyl-1,2,4-triazol may be used.

Ir(pq)2acac may be used as a yellow phosphorescent dopant, Ir(piq)2acac may be used as a red phosphorescent dopant, and Irppy3 may be used as a green phosphorescent dopant.

The hole transporting materials and the electron transporting materials may be mixed with each other in a weight ratio of about 1:9 to 9:1. The amount of the phosphorescent material may be about 1 to 20 wt % of the mixture of the hole transporting materials and the electron transporting materials.

According to an exemplary embodiment of the present invention, the entire emission layer 50 may be about 20 to 60 nm thick. The driving voltage may increase as the emission layer becomes thicker, and therefore the emission layer 50 should not be thicker than about 60 nm. The blue emission layer 50a may be about 10 to 50 nm thick. The yellow emission layer 50b may be about 10 to 50 nm thick. The red and green mixed emission layer 50c may be about 10 to 50 nm thick. The green emission layer 50d may be about 5 to 45 nm thick. The red emission layer 50e may be about 5 to 45 nm thick.

Although not shown in FIG. 1, FIG. 2, or FIG. 3, a hole blocking material may be vacuum deposited or spin coated on the emission layer 50 to form a hole blocking layer. The hole blocking material used should have an ionization potential higher than the ionization potential of the emission compound and should have an electron transporting property. For example, Balq, BCP, and TPBI may be used as the hole blocking material. The hole blocking layer may be about 30 to 70 Å thick. When the hole blocking layer is less than about 30 Å thick, the hole blocking property may not be realized. When the hole blocking layer is more than about 70 Å thick, the driving voltage may increase.

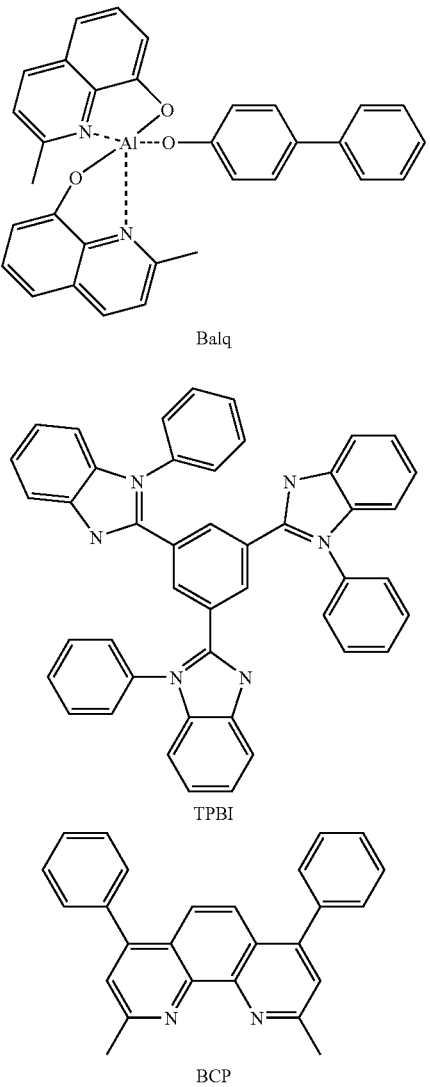

Balq

TPBI

BCP

The electron transporting material may be vacuum deposited or spin coated on the emission layer 50 or the hole blocking layer to form the electron transporting layer 60. Alq3 may be used as the electron transporting material.

The electron transporting layer 60 may be about 150 to 600 Å thick. When the electron transporting layer 60 is less than about 150 Å thick, the electron transporting property may deteriorate. When the electron transporting layer 60 is more than about 600 Å thick, the driving voltage may increase.

The electron injecting layer 70 may be stacked on the electron transporting layer 60. The electron injecting layer 70 may be formed of LiF, NaCl, CsF, Li$_2$O, BaO, or Liq. The electron injecting layer 70 may be about 5 to 20 Å thick. When the electron injecting layer 70 is less than about 5 Å thick, the electron injecting layer 70 may not operate effectively. When the electron injecting layer 70 is more than about 20 Å thick, the driving voltage may increase.

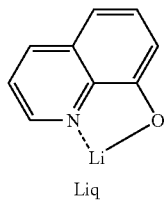

Liq

Metal to form a cathode that acts as the second electrode 80 may be vacuum thermal deposited on the electron injecting layer 70 to complete the white OLED.

Li, Mg, Al, Al—Li, Ca, Mg—In, or Mg—Ag may be used as metal for the cathode.

The present invention will now be described with reference to the following examples. However, the present invention is not limited to the examples.

EXAMPLE 1

An ITO glass substrate of 15 $\Omega/cm^2$ (1,200 Å), obtained from Corning Company, is cut to a size of 50 mm×50 mm×0.7 mm. The ITO glass substrate is ultrasonically cleaned with a solution of isopropyl alcohol and pure water for 5 minutes and then cleaned with UV and ozone for 30 minutes. After the cleaning process, the ITO glass substrate is plasma-processed under vacuum of no more than 0.1 mtorr for 9 minutes.

IDE406 from Idemitsu Co. LTD is vacuum thermal deposited on the substrate to form a 700 Å thick hole injecting layer. Then, NPD is vacuum thermal deposited on the hole injecting layer to form a 150 Å thick hole transporting layer.

CBP (4,4'-biscarbazolylbiphenyl) doped with 15 wt % FIrpic is vacuum thermal deposited on the hole transporting layer to form a 300 Å thick blue emission layer. Then, a 1:1 mixture of CBP and BCP (2,9-dimethyl-4,7-diphenyl-1,10-phenanthroline) is doped with 10 wt % Ir(pq)2acac to form a 100 Å thick yellow emission layer on the blue emission layer by vacuum thermal deposition.

Then, Alq3 is deposited on the yellow emission layer to form a 250 Å thick electron transporting layer. 10 Å of LiF and 800 Å of Al are sequentially vacuum thermal deposited on the electron transporting layer to form a LiF/Al electrode and complete the OLED.

EXAMPLE 2

An ITO glass substrate of 15 $\Omega/cm^2$ (1,200 $\Omega$), obtained from Corning Company, is cut to a size of 50 mm×50 mm×0.7 mm. The ITO glass substrate is ultrasonically cleaned with a solution of isopropyl alcohol and pure water for 5 minutes and then cleaned with UV and ozone for 30 minutes. After the cleaning process, the ITO glass substrate is plasma-processed under vacuum of no more than 0.1 mtorr for 9 minutes.

IDE406 from Idemitsu Co. LTD is vacuum thermal deposited on the substrate to form a 700 Å thick hole injecting layer. Then, NPD is vacuum thermal deposited on the hole injecting layer to form a 150 Å thick hole transporting layer.

CBP doped with 15 wt % FIrpic is vacuum thermal deposited on the hole transporting layer to form a 300 Å thick blue emission layer. Irppy3 and Ir(piq)2acac are mixed with each other in the ratio of 8:2. Then 10 wt % of the mixture of Trppy3 and Ir(piq)2acac is mixed with a 1:1 mixture of CBP and BCP to form a 100 Å thick green and red mixed emission layer by vacuum thermal deposition.

Then, Alq3 is deposited on the green and red mixed emission layer to form a 250 Å thick electron transporting layer. 10 Å of LiF and 800 Å of Al are sequentially vacuum thermal deposited on the electron transporting layer to form a LiF/Al electrode and complete the OLED.

EXAMPLE 3

An ITO glass substrate of 15$\Omega/cm^2$ (1,200Å), obtained from Corning Company, is cut to a size of 50 mm×50 mm×0.7 mm. The ITO glass substrate is ultrasonically cleaned with a solution of isopropyl alcohol and pure water for 5 minutes and then cleaned with UV and ozone for 30 minutes. After the cleaning process, the ITO glass substrate is plasma-processed under vacuum of no more than 0.1 mtorr for 9 minutes.

IDE406 from Idemitsu Co. LTD is vacuum thermal deposited on the substrate to form a 700 Å thick hole injecting layer. Then, NPD is vacuum thermal deposited on the hole injecting layer to form a 150 Å thick hole transporting layer.

CBP doped with 15 wt % FIrpic is vacuum thermal deposited on the hole transporting layer to form a 300 Å thick blue emission layer. Then, a 1:1 mixture of CBP and BCP is doped with 5 wt % Irppy3 to form a 100 Å thick green emission layer on the blue emission layer by vacuum thermal deposition. Then, a 1:1 mixture of CBP and BCP is doped with 10 wt % Ir(piq)2acac to form a 100 Å thick red emission layer on the green emission layer by vacuum thermal deposition.

Then, Alq3 is deposited on the red emission layer to form a 250 Å thick electron transporting layer. 10 Å of LiF and 800 Å of Al are sequentially vacuum thermal deposited on the electron transporting layer to form a LiF/Al electrode and complete the OLED.

COMPARATIVE EXAMPLE 1

An ITO glass substrate of 15 $\Omega/cm^2$ (1,200 Å), obtained from Corning Company, is cut to a size of 50 mm×50 mm×0.7 mm. The ITO glass substrate is ultrasonically cleaned with a solution of isopropyl alcohol and pure water for 5 minutes and then cleaned with UV and ozone for 30 minutes. After the cleaning process, the ITO glass substrate is plasma-processed under vacuum of no more than 0.1 mtorr for 9 minutes.

IDE406 from Idemitsu Co. LTD is vacuum thermal deposited on the substrate to form a 700 Å thick hole injecting layer. Then, NPD is vacuum thermal deposited on the hole injecting layer to form a 150 Å thick hole transporting layer.

CBP doped with 15 wt % FIrpic is vacuum thermal deposited on the hole transporting layer to form a 300 Å thick blue emission layer. Then, CBP doped with 10 wt % of Ir(pq)2acac is used to form a 100 Å thick yellow emission layer on the blue emission layer by vacuum thermal deposition.

Then, Alq3 is deposited on the yellow emission layer to form a 250 Å thick electron transporting layer. 10 Å of LiF and 800 Å of Al are sequentially vacuum thermal deposited on the electron transporting layer to form a LiF/Al electrode and complete the OLED.

EXPERIMENTAL EXAMPLE 1

The driving voltage, efficiency (current density), and half-life of the white OLEDs manufactured in accordance with Examples 1 to 3 and Comparative Example 1 were examined by the following methods and the results are described in Table 1.

Brightness was measured by a BM5A (Topcon) luminance meter.

Driving voltage was measured by 238 (Keithley) High Current Source Measure Unit.

Current density was measured by increasing a direct current (DC) from 10 to 100 mA/cm$^2$ by 10 mA/cm$^2$ and was measured at no less than 9 points in the same OLED.

Half-life was measured by investigating the time required to reduce the brightness of each OLED to 50% of the initial value when a current density of DC 50 mA/cm$^2$ is applied. Reproducibility of the half-life results was confirmed by three or more OLEDs having the same structure.

Chromaticity coordinates were confirmed by a PR650 spectrometer.

TABLE 1

| | Driving voltage (V) | Efficiency (cd/v) | Half-life (h) | Chromaticity (CIEx, CIEy) |
|---|---|---|---|---|
| Example 1 | 6.5 | 22 | 450 | 0.32, 0.37 |
| Example 2 | 6.7 | 25 | 400 | 0.31, 0.37 |
| Example 3 | 6.9 | 26 | 500 | 0.30, 0.35 |
| Comparative Example 1 | 8.1 | 16 | 200 | 0.32, 0.36 |

It is noted from Table 1 that the efficiency and half-life of the OLEDs of Examples 1 to 3 are larger than the efficiency and half-life of the OLED of Comparative Example 1.

EXPERIMENTAL EXAMPLE 2

Figure 4:
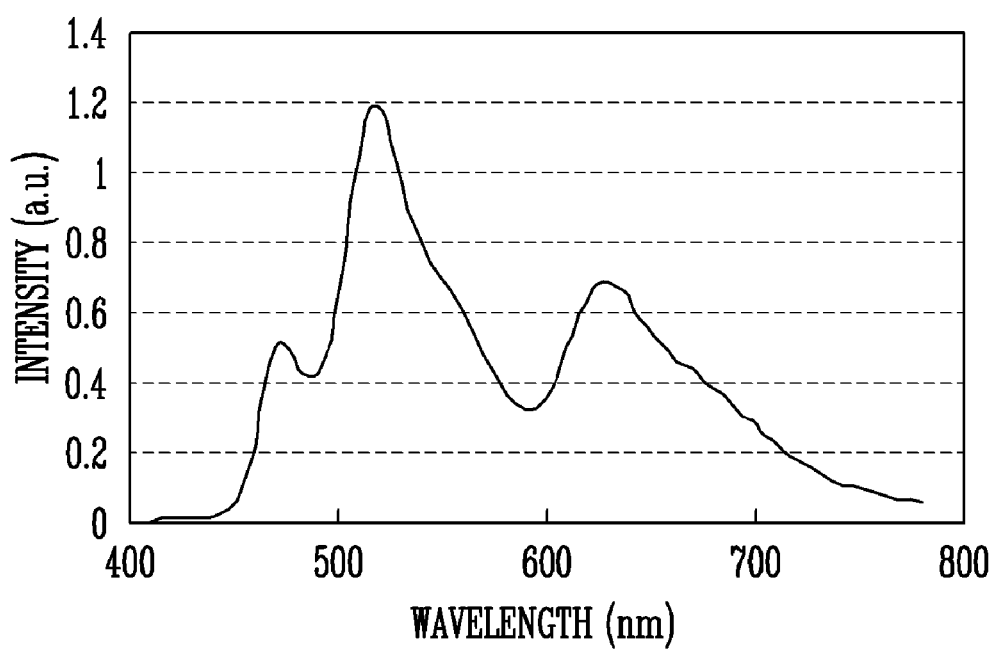
FIG. 4 is a graph that illustrates emission characteristics of the white OLED according to an exemplary embodiment of the present invention.

The emission characteristics of the OLED obtained by Example 2 were investigated and the results are described in the graph illustrated in FIG. 4.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A white organic light emitting diode, comprising:
an emission layer arranged between a first electrode and a second electrode,
wherein the emission layer comprises a blue emission layer and an emission layer excluding blue, the emission layer being capable of emitting white light,
wherein the emission layer excluding blue comprises a phosphorescent material and a mixture comprising a hole transporting material and an electron transporting material, and
wherein the blue emission layer comprises at least one material selected from the group consisting of Flrpic, biphenylanthracene, and 4,4'-bis(diphenylamino)stilbene.

2. The white organic light emitting diode of claim 1, wherein the emission layer excluding blue comprises a yellow emission layer.

3. The white organic light emitting diode of claim 1, wherein the emission layer excluding blue comprises a green and red mixed emission layer.

4. The white organic light emitting diode of claim 1, wherein the emission layer excluding blue comprises a green emission layer and a red emission layer.

5. The white organic light emitting diode of claim 1, wherein the hole transporting material comprises at least one material selected from the group consisting of 1,3,5-triscarbazolylbenzene; 4,4'-biscarbazolylbiphenyl; polyvinylcarbazole; m-biscarbazolylbiphenyl; 4,4'-biscarbazolyl-2,2'-dimethylbiphenyl; 4,4',4''-tri(N-carbazolyl)triphenylamine; 1,3,5-tris(2-carbazolylphenyl)benzene; 1,3,5-tris(2-carbazolyl-5-methoxyphenyl)benzene; and Bi(4-carbazolylphenyl)silane.

6. The white organic light emitting diode of claim 1,
wherein the electron transporting material comprises at least one material selected from the group consisting of bis(8-hydroxyquinolato)biphenoxy aluminum; bis(8-hydroxyquinolato)phenoxy aluminum; bis(2-methyl-8-hydroxyquinolato)biphenoxy aluminum; bis(2-methyl-8-hydroxyquinolato)phenoxy aluminum; bis(2-(2-hydroxyphenyl)quinolato)zinc; (4-biphenylyl)-5-(4-tert-butylphenyl-1,3,4-oxadiazol; 2,9-dimethyl-4,7-diphenyl-1,10-phenanthroline(BCP); 2,4,6-tris(diarylamino)-1,3,5-triazine; and 3-phenyl-4-(1'-naphthyl)-5-phenyl-1,2,4-triazol.

7. The white organic light emitting diode of claim 1,
wherein the weight ratio of the hole transporting material to the electron transporting material is about 1:9 to 9:1.

8. The white organic light emitting diode of claim 1,
wherein the phosphorescent material comprises at least one material selected from the group consisting of Ir(pq)2acac, Ir(piq)2acac, and Irppy3.

9. The white organic light emitting diode of claim 1,
wherein the amount of the phosphorescent material is about 1 to 20 percent by weight of the mixture of the hole transporting material and the electron transporting material.

10. The white organic light emitting diode of claim 1,
wherein the blue emission layer is about 10 to 50 nm thick.

11. The white organic light emitting diode of claim 2,
wherein the yellow emission layer is about 10 to 50 nm thick.

12. The white organic light emitting diode of claim 3,
wherein the green and red mixed emission layer is about 10 to 50 nm thick.

13. The white organic light emitting diode of claim 4,
wherein the green emission layer is about 5 to 45 nm thick, and
the red emission layer is about 5 to 45 nm thick.

14. A method of manufacturing a white organic light emitting diode, the method comprising:
forming a first electrode on a substrate;
forming a blue emission layer on the first electrode;
forming an emission layer excluding blue on the blue emission layer; and
forming a second electrode on the emission layer excluding blue,
wherein the emission layer excluding blue is formed by doping a mixture of hole transporting material and electron transporting material with phosphorescent material, and
wherein the blue emission layer comprises at least one material selected from the group consisting of Flrpic, biphenylanthracene, and 4,4'-bis(diphenylamino)stilbene.

15. The method of claim 14, further comprising:
forming a hole injecting layer or a hole transporting layer between the first electrode and the blue emission layer; and forming a hole blocking layer, an electron transporting layer, or an electron injecting layer between the emission layer excluding blue and the second electrode.

16. The method of claim 14, wherein the emission layer excluding blue comprises a yellow emission layer, a green and red mixed emission layer, or a green emission layer and a red emission layer.

17. The method of claim 14, wherein the amount of phosphorescent material is about 1 to 20% by weight of the mixture of the hole transporting material and the electron transporting material.

* * * * *